United States Patent [19]

Koyama et al.

[11] Patent Number: 4,881,273
[45] Date of Patent: Nov. 14, 1989

[54] RDS SYSTEM RADIO

[75] Inventors: Kazuo Koyama; Yoshikai Amano, both of Tokyo, Japan

[73] Assignee: Clarion Co., Ltd., Tokyo, Japan

[21] Appl. No.: 236,012

[22] Filed: Aug. 24, 1988

[30] Foreign Application Priority Data

Sep. 7, 1987 [JP] Japan .................................. 62-223773

[51] Int. Cl.⁴ .............................................. H03J 7/00
[52] U.S. Cl. .................................... 455/161; 455/166; 455/185
[58] Field of Search ................... 455/161, 70, 39, 345, 455/67, 66, 165, 164, 166, 168, 185, 186, 182

[56] References Cited

U.S. PATENT DOCUMENTS 4,276,654  5/1981  Nation et al. .................. 455/161
4,392,247  7/1983  Van Deursen .................. 455/161
4,682,370  7/1987  Matthews ....................... 455/186

OTHER PUBLICATIONS

*Specification of the Radio Data System RDS for VHS/FM Sound Broadcasting* Tech 3244—E, Mar. 1984, European Broadcasting Union, Technical Center—Brussels.

Joseph J. Carr, *Electronic Signal Seeking Car Radio—How They Work,* Jun. 1979, pp. 51–58.

Primary Examiner—Robert L. Griffin
Assistant Examiner—Curtis A. Kuntz
Attorney, Agent, or Firm—Flynn, Thiel, Boutell & Tanis

[57] ABSTRACT

An RDS-system radio having an automatic tuning function which is configured to compare program information codes of a currently received broadcasting and other broadcastings in a seeking or scanning operation to avoid switching to new broadcastings which are identical to the currently received broadcasting in order to prevent useless steps in the seeking or scanning operation.

6 Claims, 3 Drawing Sheets

RDS SYSTEM RADIO

FIELD OF THE INVENTION

This invention relates to an RDS system radio, in particular, of a type having a seek, scan or other automatic tuning function.

DESCRIPTION OF THE PRIOR ART

Not only in an RDS (radio data system) system radio but also in other prior art radio having an automatic tuning function, when a scan or seek operation is effected, the radio stops its scan or seek operation upon catching a broadcasting of a field strength above a predetermined level and starts reception of the broadcasting. In the case, since a condition for stopping the automatic tuning and starting the reception is only that the field strength is above a predetermined level, the radio stops its tuning operation and starts the reception also when it is the same broadcasting as that heretofore listened to.

However, considering the reason why a user effects a seek or scan operation, a user has a purpose of searching any other broadcasting he desires. Therefore, it is a useless operation to tune at the same broadcasting as that heretofore received. This useless operation causes a delay of the seek or scan operation, and particularly in a seek operation, a certain key operation is required once more to search another broadcasting.

SUMMARY OF THE INVENTION

This invention has been made to improve the aforementioned drawbacks of the prior art, and is characterized basically in that in sequentially changing the received frequency in order to change the received broadcasting from one to another, a PI (program identification) code of a broadcasting heretofore received is compared to a PI code of a newly received broadcasting so that the newly received broadcasting is not selected when these PI codes coincide.

DETAILED DESCRIPTION

Figure 1:
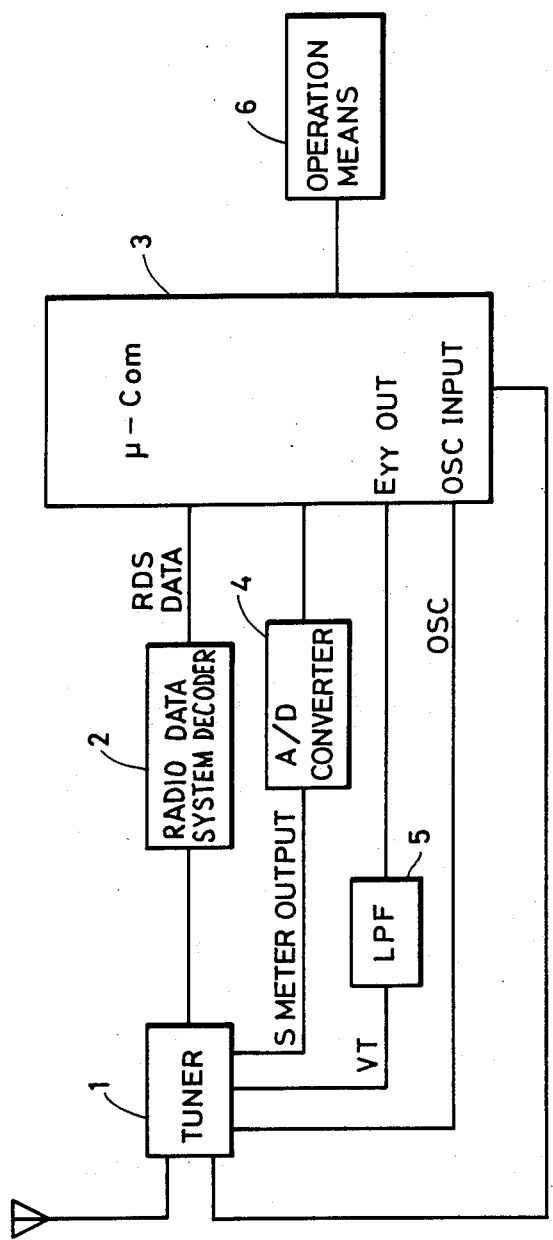
FIG. 1 is a block diagram showing an arrangement of an RDS-system radio to which the invention can be applied.

The invention is described below, referring to a preferred embodiment illustrated in the drawings.

FIG. 1 shows an arrangement of an RDS-system radio.

An RDS (radio data system) broadcasting received by a tuner 1 through an antenna is decoded in an RDS decoder 2 and is subsequently entered in a microcomputer 3 as RDS data. The RDS data includes a PI (program identification) code which identifies the broadcasting.

The tuner 1 sends an S meter (signal meter) output showing the field strength of the broadcasting in reception to the microcomputer 3 through an A/D (analog-to-digital) converter 4. Reference numeral 5 denotes a low-pass filter.

When a signal for instructing a seek operation is applied by an operation means 6, the microcomputer 3 controls the tuner 1 o change the received frequency sequentially and, in receipt of field strength information from the A/D converter 4, stop the seek operation at the frequency having a predetermined field intensity and effect reception at the frequency.

Similarly, when a signal for instructing a scan operation is applied from the operation means 6 to the microcomputer 3, the microcomputer 3 controls the tuner 1 to repeat motions of sequentially receiving station having received field intensities above a predetermined level by a predetermined time.

In the prior art, if a frequency has a predetermined field intensity, reception is always effected at the frequency, and it was not judged at all whether it is the same as the broadcasting program heretofore received.

In the embodiment of the invention, the microcomputer 3 effects comparison of the PI code included in the RDS data from the RDS decoder 2. That is, the PI code of the broadcasting program heretofore received is compared to a PI code of a broadcasting program to be received subsequently by changing the frequency. If these PI codes are identical, the same broadcasting is identified. Therefore, the microcomputer 3 controls the tuner 1 to not receive the broadcasting of the frequency and switch to a subsequent frequency to receive another broadcasting.

Figure 2:
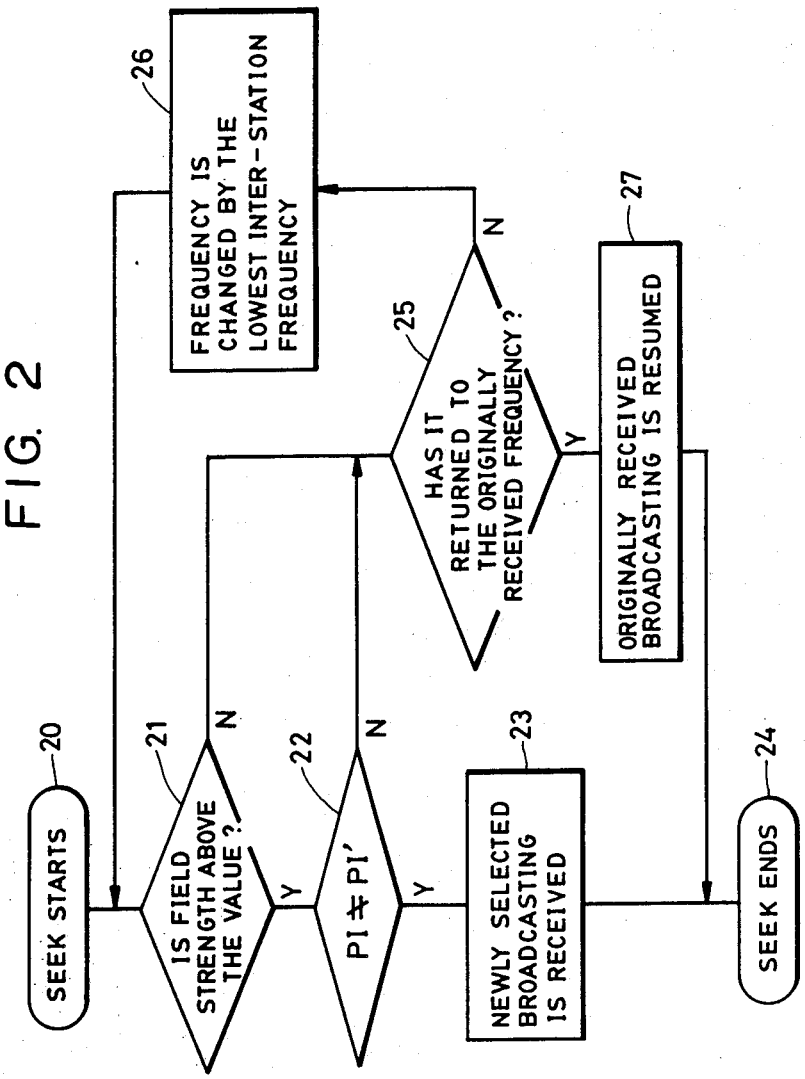
FIG. 2 is a flowchart showing a general seek operation according to the invention.

FIG. 2 shows a flowchart of a seek operation. When an operator effects a seek-starting operation, the microcomputer 3 controls the tuner 1 to start the seek (step 20). At first, the microcomputer 3 sets the tuner 1 at a predetermined frequency, enters its S meter output from the A/D converter 4, and judges whether the field strength is above a predetermined level (step 21). When the field strength is above the level, the PI code (PI) of the presently received broadcasting program is compared to the PI code (PI') of the newly selected broadcasting program in the RDS data from the RDS decoder 2 (step 22). When PI is different from PI', the newly selected broadcasting is received (step 23). When PI and PI' are identical, the microcomputer 3 controls the tuner 1 to not receive the newly selected broadcasting, and after checking whether it returned to the original frequency or not (step 25), raise (or drop) the frequency by the minimum inter-station frequency (step 26) and select a next broadcasting, returning to step 21. After a newly selected broadcasting is received in step 23, the seek is finished (step 24). When the seek returns to the original frequency in step 25, this means that there is no new broadcasting to switch to, and it returns to the originally received broadcasting (step 27), and the seek operation is finished.

Figure 3:
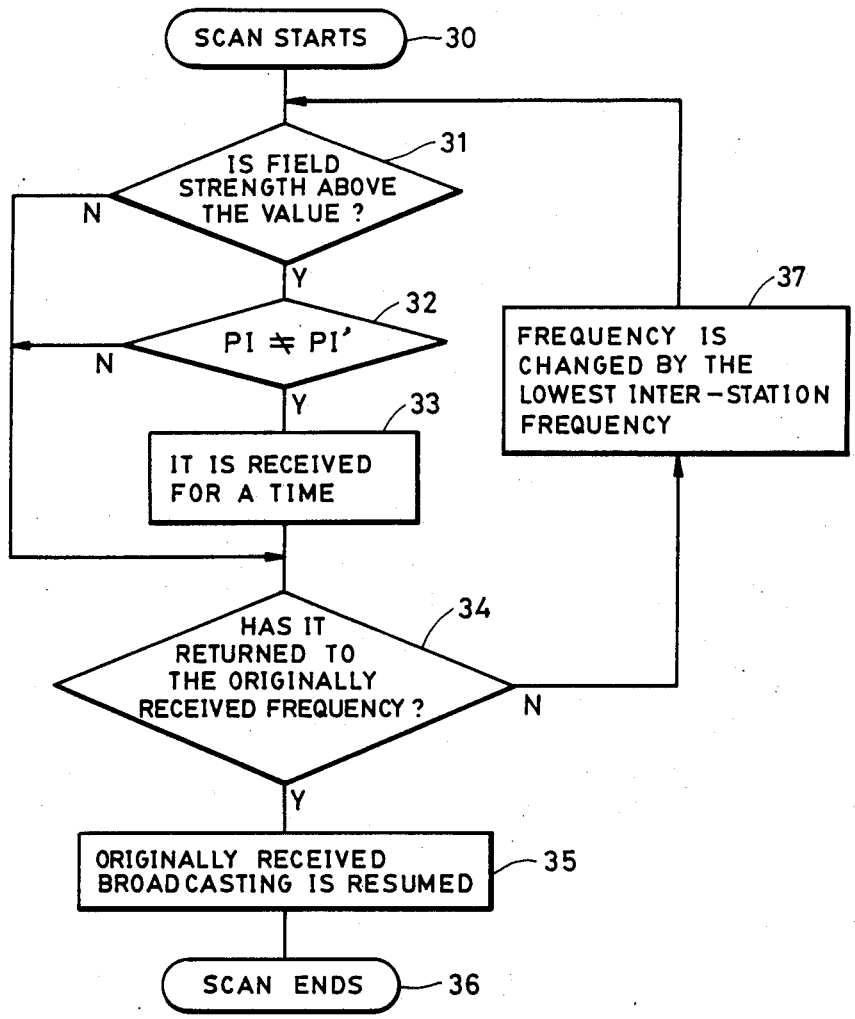
FIG. 3 is a flowchart showing a general scan operation according to the invention.

FIG. 3 shows a flowchart of a scanning operation.

Upon a user's operation for starting a scanning, the microcomputer 3 controls the tuner 1 to start such a scanning (step 30), sets the tuner 1 at a predetermined frequency, enters its field strength signal from the A/D converter 4, and judges whether the field strength of the broadcasting is above a predetermined value or not (step 31). When the field strength is above the level, the PI code PI of the presently received broadcasting program is compared to the PI code PI' of the newly selected broadcasting program (step 32). When PI and PI' are not identical, the newly selected broadcasting is received for a predetermined time (step 33).

When PI and PI' are identical, the microcomputer 3 controls the RDS decoder 2 to not receive the newly selected broadcasting and jump step 33 to check whether it has returned to the originally received frequency or not (step 34), raise (or drop) the frequency by the lowest inter-station frequency (step 37), select a next broadcasting, returning to step 31, and repeat the same operation. Also when the frequency does not reach the predetermined field strength, the scanning jumps to step 34.

After reception for a predetermined time in step 33, the scanning traces step 34, and in step 37 selects a next broadcasting, repeating the aforementioned operation.

When the scanning returns to the originally received frequency in step 34, this means that there is not new broadcasting to switch to, and it returns to the originally received broadcasting (step 35), and the scanning is finished (step 36).

As described above, since the inventive reception method is arranged so that when changing from a presently received broadcasting to another broadcasting by switching the received frequency sequentially, a PI code of the presently received broadcasting is compared to a PI code of a newly received broadcasting in order to not receive the new broadcasting when these PI codes are identical, no useless operation occurs, and the operating speed of the radio in scanning or seeking operations is improved.

What is claimed is:

1. An RDS-system radio which can receive broadcast waves each including an RDS code containing a program identification code and which has an automatic tuning operation, comprising:
    tuner means for selecting and receiving a desired broadcasting wave;
    RDS decoder means for decoding the RDS code included in a broadcasting wave received by said tuner means;
    control means coupled to said tuner means and responsive to said RDS decoder means in an arithmetic tuning mode for causing said tuner means to switch from receiving an originally broadcasting wave to a first new broadcasting wave if the program identification code of the original broadcasting wave is different from the program identification code of the new broadcasting wave, and for causing said tuner means not to switch to the first new broadcasting wave but to switch to receive a second new broadcasting wave having a program identification code different from the program identification code of said original broadcasting wave when said program identification codes of said original broadcasting wave and said first new broadcasting wave are identical; and
    operation means for causing said control means to initiate said automatic tuning mode.

2. An RDS-system radio according to claim 1, wherein after causing said tuner means to switching to receive one of said new broadcasting waves in said automatic tuning mode said control means causes said tuner means to continue receiving that new broadcasting wave until said operation means initiates a further switch in broadcasting waves.

3. An RDS-system radio according to claim 1, wherein a predetermined time interval after causing said tuner means to switch to receive one of said new broadcasting waves in said automatic tuning more, said control means initiates a further switch in broadcasting waves.

4. An RDS radio system which can receive broadcasting waves each including an RDS code containing a program identification code, comprising: tuner means for selecting and receiving a specified broadcasting wave; RDS decoder means coupled to said tuner means for decoding the RDS code included in a broadcasting wave being received by said tuner means; control means cooperable with said tuner means for specifying a broadcasting wave said tuner means is to select and receive, said control means being responsive to said RDS decoder means in an automatic tuning mode for initiating a check of program identification codes from said RDS decoder means for a series of broadcasting waved different from a first specified broadcasting wave which said tuner means has been receiving and for causing said tuner means to switch from reception of said first specified broadcasting wave to reception of a second specified broadcasting wave which is the first of the broadcasting waves in said series having a program identification code different from the program identification code of said first specified broadcasting wave; and
    operation means for causing said control means to initiate said automatic tuning mode.

5. A system according to claim 4, wherein said control means terminates said automatic tuning mode after locating said second specified broadcasting wave in said series, and thereafter causes said tuning means to continue receiving said second specified broadcasting wave until instructed by said operation means to effect a further change in broadcasting waves.

6. A system according to claim 4, wherein said control means remains in said automatic tuning mode until said automatic tuning mode is terminated by said operation means, said control means causing said tuner means to receive said second specified broadcasting wave for a predetermined interval of time, then continuing said check of the program identification codes in said series of said broadcasting waves and causing said tuner means to carry out reception of a third specified broadcasting wave which is a broadcasting wave from said series having a program identification code different from the program identification code of said second specified broadcasting wave.

* * * * *

UNITED STATES PATENT AND TRADEMARK OFFICE
CERTIFICATE OF CORRECTION

PATENT NO. : 4 881 273
DATED : November 14, 1989
INVENTOR(S) : Kazuo KOYAMA et al It is certified that error appears in the above-identified patent and that said Letters Patent is hereby corrected as shown below:

Column 3, line 27; change "broadcast" to ---broadcasting---.
          lines 37 & 38; change "arithmetic" to ---automatic---.
          line 39; change "originally" to ---original---.
          line 55; change "switching" to ---switch---.
Column 4, line 8; change "more" to ---mode---.
          line 24; change "waved" to ---waves---.

On the first page of the patent document, change the second inventor's name from "Yoshikai Amano" to ---Yoshiaki Amano---.

Signed and Sealed this

Sixteenth Day of October, 1990

Attest:

HARRY F. MANBECK, JR.

Attesting Officer      Commissioner of Patents and Trademarks